US012566907B2

(12) United States Patent
Ma et al.

(10) Patent No.: US 12,566,907 B2
(45) Date of Patent: Mar. 3, 2026

(54) HYPERSPACE-BASED PROCESSING OF DATASETS FOR ELECTRONIC DESIGN AUTOMATION (EDA) APPLICATIONS

(71) Applicant: Siemens Industry Software Inc., Plano, TX (US)

(72) Inventors: Yuansheng Ma, Fremont, CA (US); Le Hong, Benicia, CA (US)

(73) Assignee: Siemens Industry Software Inc., Plano, TX (US)

( * ) Notice: Subject to any disclaimer, the term of this patent is extended or adjusted under 35 U.S.C. 154(b) by 596 days.

(21) Appl. No.: 18/002,127

(22) PCT Filed: Jul. 8, 2020

(86) PCT No.: PCT/US2020/041153
§ 371 (c)(1),
(2) Date: Dec. 16, 2022

(87) PCT Pub. No.: WO2022/010468
PCT Pub. Date: Jan. 13, 2022

(65) Prior Publication Data
US 2023/0214562 A1 Jul. 6, 2023

(51) Int. Cl.
*G06F 30/31* (2020.01)

(52) U.S. Cl.
CPC .................................... *G06F 30/31* (2020.01)

(58) Field of Classification Search
CPC ...... G06F 30/398; G06F 30/20; G06F 30/392; G06F 30/367; G06F 30/327; G06F 30/31;
(Continued)

(56) References Cited

U.S. PATENT DOCUMENTS

2013/0074024 A1*  3/2013  Chase ................... G06F 30/398
                                                        716/112
2014/0270561 A1    9/2014  Matthews
                              (Continued)

FOREIGN PATENT DOCUMENTS

CN      110175642 A      8/2019
WO      2014127224 A1    8/2014
WO      2014153169 A2    9/2014

OTHER PUBLICATIONS

Brause R w: "Cascaded vector quantization by non-linear PCA network layers", Tools With Artificial Intelligence, 1994. Proceedings., Sixth Internat ional Conference On New Orleans, LA, USA Nov. 6-9, 1994, Los Alamitos, CA, USA,IEEE Comput. Soc, Nov. 6, 1994 (Nov. 6, 1994), pp. 154-160, XP010100919.

*Primary Examiner* — Binh C Tat

(57) ABSTRACT

A computing system may include a hyperspace generation engine and a hyperspace processing engine. The hyperspace generation engine may be configured to access a feature vector set, and feature vectors in the feature vector set may represent values for multiple parameters of data points in a dataset. The hyperspace generation engine may further be configured to perform a principal component analysis on the feature vector set and quantize the principal component space into a hyperspace comprised of hyperboxes. The hyperspace processing engine may be configured to process the dataset according to a mapping of the feature vector set into the hyperboxes of the hyperspace.

14 Claims, 7 Drawing Sheets

(58) Field of Classification Search
CPC ...... G06F 2119/18; G06F 3/015; G06F 30/27;
G06F 3/00; G03F 7/705; G03F 7/70441;
G03F 7/706841; G03F 1/36; G03F 1/70;
G03F 7/70525; G03F 7/70483; G06T
2207/30148
USPC ................................................. 716/100–108
See application file for complete search history.

(56) References Cited

U.S. PATENT DOCUMENTS

2017/0076116 A1 *   3/2017   Chen ..................... G06F 21/554
2018/0314148 A1 *  11/2018   Tetiker ................ H01J 37/3244

* cited by examiner

Computing System 100

Hyperspace Generation Engine 110

Hyperspace Processing Engine 112

600

Access a feature vector set that represents points of a dataset　602

Perform principal component analysis on the feature vector set　604

Quantize the principal component space into a hyperspace comprised of hyperboxes　606

Process the dataset according to a mapping of the feature vector set into the hyperboxes of the hyperspace　608

HYPERSPACE-BASED PROCESSING OF DATASETS FOR ELECTRONIC DESIGN AUTOMATION (EDA) APPLICATIONS

BACKGROUND

With modern technological advances, computing systems may access, generate, and process increasing quantities of data. Complex datasets may include numerous data points, and can easily number into the hundreds of millions, billions, trillions, or more of data samples. In electronic design automation (EDA) technologies in which integrated circuit technologies are becoming increasingly complex, EDA processes may generate, consume, or other process datasets of increasingly large sizes.

BRIEF DESCRIPTION OF THE DRAWINGS

Certain examples are described in the following detailed description and in reference to the drawings.

DETAILED DESCRIPTION

Figure 1:
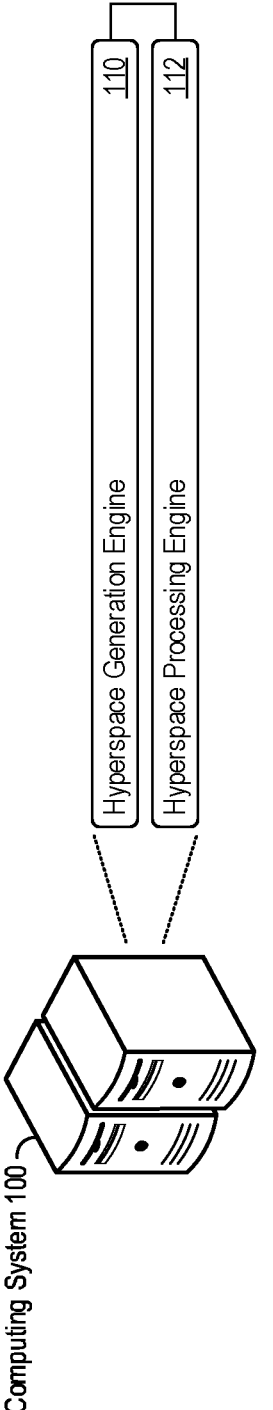
FIG. 1 shows an example of a computing system that supports hyperspace generation and hyperspace-based processing of datasets.

Modern computing systems and applications can generate immense amounts of data. Processing of such data may require intense computing resources, particularly as data points in large datasets number in the hundreds of millions, billions, trillions, and possibly more. Example dataset analyses may include classification or down sampling processes, and meaningful classification, down sampling, or other processing of large datasets may incur unacceptable performance penalties for modern computing systems and applications. While simplistic processing techniques, such as random shuffle down selections, may be performed on large datasets, such processing techniques may be unsuitable in consistently capturing outlier data points necessary for accurate processing of datasets. Some classification techniques like K-means clustering or mahalanobis cluster computations can provide classification capabilities, but at $O(n^2)$ complexity. For datasets numbering in the millions or more, dataset classification using such techniques of $O(n^2)$ complexity may take inordinate amounts of time or require impractically large or sophisticated computing systems.

Within the EDA context, datasets generated or used for EDA processes are increasing in size due to increased integrated circuit (IC) complexities. Meaningful classification, down sampling, or other processing of such immense EDA datasets using existing techniques of $O(n^2)$ complexity may be challenging, time-consuming, inaccurate, or require an impractical amount of computing resources. For instance, optical or resist model calibration flows may require the accuracy of scanning electron beam microscopy (SEM) measurements on manufactured chips, but SEM technology may be limited in measurement bandwidth and require down selection from tens of million (or more) of potential point-of-interest chip locations. As another example, machine-learning (ML)-based optical proximity correction (OPC) model calibrations may be limited in effectiveness when training sets exceed millions of training data samples, but EDA applications may easily obtain tens or hundreds of millions of OPC sample points. In a similar manner, fuzzy pattern matching of circuit portions for design for manufacture (DFM), hotspot prediction, or other EDA processes may require tens or hundreds of millions of circuit image comparisons, and classification analyses of such large EDA datasets using existing techniques of $O(n^2)$ complexity may be impractical for existing EDA systems in terms of computation latency and requisite computing resources.

The disclosure herein may provide systems, methods, devices, and logic for hyperspace generation and hyperspace-based processing of datasets. As used herein, a hyperspace may refer to or include a coordinate space with multiple dimensions to map multiple parameter values of data points in a dataset (whether directly or as transformed parameters), and with at least a portion of the coordinate system partitioned into hyperboxes. Hyperboxes of a generated hyperspace may be used to process large datasets in an efficient and accurate manner. As described in greater detail herein, hyperspaces may be generated by transforming a feature space of a dataset and quantizing the transformed feature space into a set of hyperboxes. Processing of the dataset may be performed by processing the quantized hyperboxes of the hyperspace that contain at least one or more mapped feature vectors of the dataset. Dimension determinations of the hyperboxes may account for data variance in the data points of a dataset, and hyperspace-based processing of datasets may increase the scope consistency in down sampled datasets, classification accuracy, or a combination of both.

The hyperspace generation and hyperspace-based processing features described herein may have $O(n)$ complexity, and the described hyperspace features may thus exhibit increased computational efficiency and speed as compared to other $O(n^2)$ processing techniques, whether in execution latency or required computing resources. In the EDA context specifically, the hyperspace features of the present disclosure may increase the computational efficiency of processing EDA datasets for ML-based OPC model calibrations, fuzzy pattern matching for DFM processes, down selection of SEM measurement targets, and many more. Additionally or alternatively, the hyperspace features described herein may support identification, sampling, or other processing of outlier data points in a dataset, which may increase the accuracy or coverage of EDA hotspot predictions analyses, SEM measurements, or other EDA dataset analyses as compared to simplistic random down selection techniques.

These and other hyperspace features and technical benefits according to the present disclosure are described in greater detail herein.

FIG. 1 shows an example of a computing system 100 that supports hyperspace generation and hyperspace-based processing of datasets. The computing system 100 may take the form of a single or multiple computing devices such as application servers, compute nodes, desktop or laptop computers, smart phones or other mobile devices, tablet devices, embedded controllers, and more. The computing system 100 may implement any type of application, circuitry, or data processing system to generate, consume, analyze, or otherwise process data. As but a few illustrative examples, the computing system 100 may take the form of an EDA system that implements EDA application features, a medical analysis system configured to analyze DNA strands or other complex biological datasets, a process automation system with analysis capabilities for data points captured by complex internet-of-things (IoT) sensor systems, traffic controller systems configured to process and react to real-time measurement of vehicle traffic data points, and near-countless more.

The computing system 100 may implement any of the hyperspace features described herein. In doing so, the computing system 100 may generate a hyperspace for a dataset, including through transforming a feature space of a feature vector set representative of the dataset. Transformation of the feature space may be performed through any number of multi-variate analyses, and the computing system 100 may further quantize the transformed feature space by partitioning the transformed feature space (or at least a portion thereof) into a set of hyperboxes. Dimension values of the hyperboxes may be determined by the computing system 100 to specifically account for variance among parameters of the transformed feature space (e.g., based on dataset variance attributable to the principal components of the transformed feature space). Through such a generated hyperspace, the computing system 100 may support hyperspace-based processing of the original dataset from which the hyperspace was generated, other datasets different from the original dataset, or combinations of both.

As an example implementation to support any combination of the hyperspace features described herein, the computing system 100 shown in FIG. 1 includes a hyperspace generation engine 110 and a hyperspace processing engine 112. The computing system 100 may implement the engines 110 and 112 (including components thereof) in various ways, for example as hardware and programming. The programming for the engines 110 and 112 may take the form of processor-executable instructions stored on a non-transitory machine-readable storage medium and the hardware for the engines 110 and 112 may include a processor to execute those instructions. A processor may take the form of single processor or multi-processor systems, and in some examples, the computing system 100 implements multiple engines using the same computing system features or hardware components (e.g., a common processor or a common storage medium).

In operation, the hyperspace generation engine 110 may access a feature vector set, and a given feature vector in the feature vector set may represent values for multiple parameters of a given data point in a dataset. In operation, the hyperspace generation engine 110 may further perform a principal component analysis on the feature vector set, and the principal component analysis may transform a feature space of the feature vector set into a principal component space comprised of principal component axes rotated from the feature space. Rotation of the principal component axes from the feature space may be based on eigenvalues determined for the principal components of the principal component space. The hyperspace generation engine 110 may also quantize the principal component space into a hyperspace comprised of hyperboxes, in any of the various ways as described herein. In operation, the hyperspace processing engine 112 may process the dataset according to a mapping of the feature vector set into the hyperboxes of the hyperspace, doing so in any of the various ways described herein.

These and other hyperspace features are described in greater detail next. Some specific examples are presented herein within the context of EDA processes, capabilities, features, and datasets. However, any combination of the hyperspace features described herein may be consistently applicable to any type of dataset of any type of field, such as airport screenings, medical diagnoses, smart grid optimizations, cybersecurity analyses of network packet data, credit card fraud detections, and near-countless other applications for processing datasets of any type.

Figure 2:
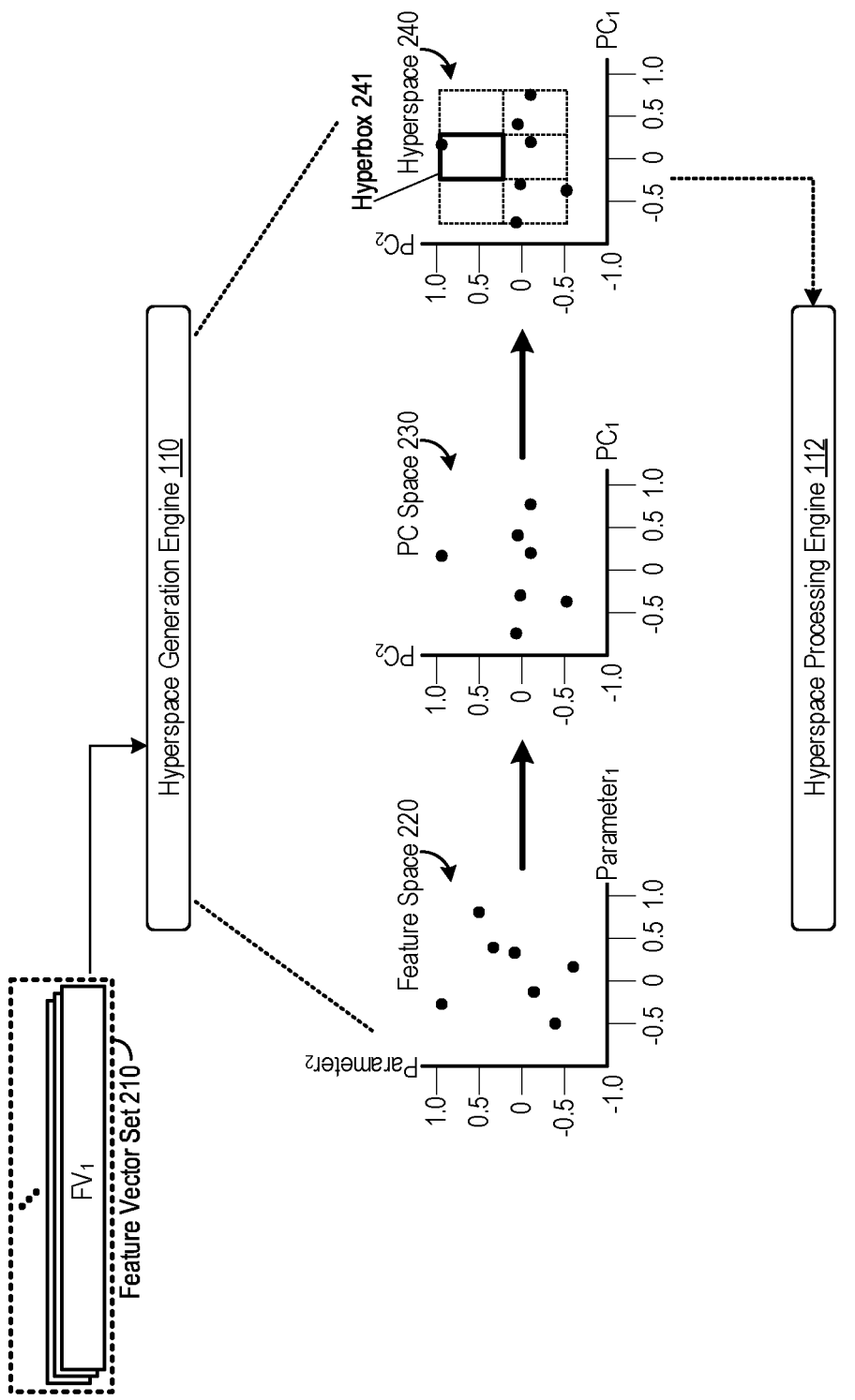
FIG. 2 shows an example hyperspace generation by a hyperspace generation engine.

FIG. 2 shows an example hyperspace generation by the hyperspace generation engine 110. As noted herein, a hyperspace may refer to or include a coordinate space with multiple dimensions to map multiple parameter values of data points in a dataset (whether directly or as transformed parameters), and with at least a portion of the coordinate system partitioned into hyperboxes. The hyperspace generation engine 110 may generate a hyperspace comprised of hyperboxes for any type of dataset, including large datasets with a number of data points in the tens or hundreds of millions, billions, trillions, or more. Each data point in a dataset may represent a discrete data sample, such as circuit location or OPC fragment in an EDA context, credit card transactions in a banking context, packets in a network architecture system, patient data in a medical context, etc.

To generate a hyperspace for a given dataset, the hyperspace generation engine 110 may access a feature vector set for the dataset. In the example shown in FIG. 2, the hyperspace generation engine 110 accesses the feature vector set 210. The feature vector set 210 may be comprised of feature vectors, and each feature vector in the feature vector set 210 may represent a discrete data point in a dataset. In that sense, the hyperspace generation engine 110 may support analysis and processing of a dataset via a feature vector set representative of the dataset. Feature vectors accessed by the hyperspace generation engine 110 may be implemented in any format, and feature vectors of the feature vector set 210 may track any number of characteristics of a data points of the dataset. In some implementations, feature vectors may take the form of n-dimensional vectors of numerical parameters values captured for data points of a dataset. As an illustrative example, each feature vector in the feature vector set 210 may represent a point-of-interest located on an IC design and example parameter values of the feature vectors may numerically represent OPC fragment and geometry data, chip positional data, corresponding circuit layout data, or any number of additional or alternative characteristics of point-of-interest chip locations.

As such, the hyperspace generation engine 110 may support hyperspace generation and hyperspace-based processing using feature vectors of any format, type, or representation. The specific parameters represented in feature vectors of the feature vector set 210 may be predetermined, configurable, or both. In that regard, the hyperspace generation engine 110 may flexibly support processing of input datasets of various types and configurations. The hyperspace generation engine 110 also need not be limited to a fixed or threshold number of data point parameters represented in the feature vector set 210, and may flexibly support processing and analysis of datasets of varying complexity and scope.

In some implementations, hyperspace generation engine 110 itself may generate the feature vector set 210 from an input dataset by extracting parameter values of data points in the input dataset according to a configured feature vector format. In other implementations, the feature vector set 210 may be generated or extracted by another computing entity, e.g., another component or module of an EDA application that configures the feature vector set 210 into a specific feature vector format of relevant data point characteristics.

Feature vectors in the feature vector set 210 may be normalized, whether by the hyperspace generation engine 110 upon access of the feature vector set 210, or in other implementations prior to access of the feature vector set 210 by the hyperspace generation engine 110. Any number of normalization techniques may be applied to normalize the parameter values of accessed feature vectors, for example through min/max scaler, standard scaler, or other normalization processes. Normalization of the feature vector set 210 (whether by the hyperspace generation engine 110 or another entity) may reduce artificial weight differences between features (e.g., parameters), particularly when features are measured in different units, and doing so may increase data integrity in representing the dataset as a feature vector set.

Continuing the hyperspace generation example, the hyperspace generation engine 110 may transform a feature space of an accessed feature vector set using any number of multi-variate analysis techniques. The feature space of a feature vector set may refer to a coordinate system with a number of dimensions equal to the number of parameters represented in feature vectors of the feature vector set, and each axis of the feature space may represent values of a corresponding parameter. For feature vectors that capture twelve (12) different parameters of data points in a dataset, the feature space of such a feature vector set may be 12-dimensional, and likewise feature vectors that capture 'n' different parameters may be represented in a n-dimensional feature space. An example of (at least a portion of) a feature space for the feature vector set 210 is shown in FIG. 2 as the feature space 220. For the sake of visual clarity, only two dimensions of the feature space 220 are illustrated, specifically for $parameter_1$ and $parameter_2$ of the feature vector set 210. Each dot in the feature space 220 may represent a feature vector of the feature vector set 210, and may be mapped in the feature space 220 according to the feature vector's parameter values of $parameter_1$ and $parameter_2$ respectively.

The hyperspace generation engine 110 may transform a feature space of a feature vector set through any multi-variate analysis process that measures, characterizes, or represents the data variance of data points in the dataset. Variance (also referred to as data variance or dataset variance) may refer to any measurement of the spread of datapoints in a dataset, whether for a particular dimension of the dataset or the data points of the dataset as a whole. In some instances, variance may be computed by the hyperspace generation engine 110 as average of squared differences from a mean value of the dataset or dataset dimension. Any form of variance for a dataset is contemplated herein.

In some implementations, the hyperspace generation engine 110 transforms a feature space through principal component analysis (PCA). As such, the hyperspace generation engine 110 may implement any type of PCA or any other multi-variate transformation or dimensionality reduction capabilities to support the transformation of feature spaces. By performing PCA (or any other multi-variate transformation) on a feature space of an accessed feature vector set, the hyperspace generation engine 110 may map the feature vector set into a different coordinate system that further correlates the parameter values of a dataset and supports variance determinations in the dataset through the transformation.

To illustrate, the hyperspace generation engine 110 may perform PCA to transform the feature space 220 of FIG. 2 into the principal component space 230 shown in FIG. 2. The principal component space 230 is shown in FIG. 2 as a two-dimensional coordinate system that maps values for principal components $PC_1$ and $PC_2$ through principal component axes. Each principal component of the principal component space 230 may be a combination of the parameters of the feature space 220. Explained in another way, the principal component axes of the principal component space 230 may be rotated from the feature space 220 by the hyperspace generation engine 110, and rotation of the principal component axes from the feature space 220 may be based on eigenvectors or eigenvalues determined for the principal components of the principal component space 230. Each dot in the principal component space 230 may represent a feature vector of the feature vector set 210 (and thus a distinct data point of a dataset), but mapped into the principal component space 230 as feature vectors transformed into principal component values. Feature vectors mapped into a transformed feature space (e.g., the principal component space 310) are referred to herein as transformed feature vectors.

In some implementations, the hyperspace generation engine 110 may represent transformation from a feature space into a corresponding principal component space through a covariance (or correlation) matrix, and eigenvectors of the covariance matrix may represent how each parameter of a feature space maps to each principal component of the principal component space. The hyperspace generation engine 110 may further determine eigenvalues for each principal component of a principal component space, and determined principal component eigenvalues may represent the dataset variance attributable to the principal component on the dataset (e.g., a higher eigenvalue may indicate that a given principal component exhibits, measures, or characterizes a greater data variance for the dataset relative to other principal components with lower eigenvalues).

In the example of FIG. 2, the hyperspace generation engine 110 may generate the principal component space 230 to include at least two dimensions, including along axes for $principal\ component_1$ and $principal\ component_2$ respectively (only two dimensions of the principal component space 310 are depicted in FIG. 2 for visual clarity). In some implementations, the hyperspace generation engine 110 may reduce the dimensionality of a transformed feature space (e.g., a principal component space), and may do so in any number of ways. In some implementations, the hyperspace generation engine 110 may reduce a number of dimensions in a principal component space to a threshold number of principal components with the highest variance for a dataset. As an illustrative example, the hyperspace generation engine 110 may reduce the dimensionality for a feature vector set with parameter values for fifteen parameters (and thus fifteen dimensions) into a ten-dimensional principal component space, and do so by removing the five principal components transformed from the feature space with a lowest dataset variance (e.g., lowest determined eigenvalues). Note that the hyperspace generation engine 110 need not reduce dimensionality of transformed feature spaces, and thus a principal component space generated by the hyperspace generation engine 110 may have a dimensionality equal to the dimensionality of a corresponding feature vector set (in which case the number of principal components in a principal component space is equal to a number of parameters characterized in feature vectors of the feature vector set).

Returning to the example in FIG. 2, the hyperspace generation engine 110 may generate a hyperspace from a transformed feature space. The hyperspace generation engine 110 may do so by quantizing the transformed feature space (or at least a portion thereof) into a set of hyperboxes. Quantizing a transformed feature space may refer to partitioning at least a portion of the transformed feature space into hyperboxes, and hyperboxes may refer to an 'n'-dimensional enclosed shape with hyperbox dimension values along each dimension of the transformed feature space determined by the hyperspace generation engine 110. In particular, the number of a dimensions of hyperboxes of a hyperspace may be equal to the number of dimensions of the transformed feature space. For PCA transformations, hyperboxes quantized by the hyperspace generation engine 110 may have a dimension size for each principal component of a principal component space. The dimension size of hyperboxes along a given principal component axis in a principal component space may be determined by the hyperspace generation engine 110 as a function of the determined eigenvalue of the principal component of the given principal component axis, described in greater detail herein.

An example of a hyperspace generated by the hyperspace generation engine 110 is illustrated in FIG. 2 as the hyperspace 240. In this example of FIG. 2, the hyperspace 240 includes six (6) hyperboxes, including a hyperbox 241 with a solid perimeter and five (5) other unlabeled hyperboxes. Collectively, the six (6) example hyperboxes of FIG. 2 encapsulate the transformed feature vectors of a dataset mapped into the principal component space 230. In that regard, the hyperspace 240 may take the form of a transformed feature space (e.g., the principal component space 230) partitioned into a set of hyperboxes.

In some implementations, the hyperspace generation engine 110 may represent hyperboxes as 'n'-orthotopes (also referred to as hyperrectangles), which may take the form of multi-dimensional bounding shapes with orthogonal faces. As noted herein, the number of dimensions 'n' of hyperboxes in a hyperspace may be equal to the number of dimensions of a transformed feature space from which the hyperspace is quantized. For instance, the hyperspace generation engine 110 may generate a hyperspace by quantizing a 5-dimensional principal component space (or a portion thereof) into a set of 5-dimensional hyperboxes. Dimension determinations for hyperboxes of a quantized hyperspace may vary based on the variance of corresponding principal components, for example as discussed below with reference to FIG. 3.

The hyperspace generation engine 110 may quantize transformed feature spaces with hyperboxes in order to process, classify, or otherwise analyze datasets through the quantization. In one sense, hyperboxes generated by the hyperspace generation engine 110 may represent a given cluster or a given classification unit in a transformed feature space by which the hyperspace processing engine 112 or another processing entity may interpret, process, analyze, or characterize data points in a dataset. Moreover, the hyperspace generation engine 110 may selectively determine the dimension of hyperboxes in a hyperspace, and may do so based on principal component variances, variance ratios amongst different principal components, user-specified or configurable dimension parameters, or in other ways to specifically partition a transformed feature space to support subsequent characterization and data processing of transformed feature vectors mapped into a hyperspace.

Determinations of hyperbox dimension values are described in greater detail next with reference to FIG. 3.

Figure 3:
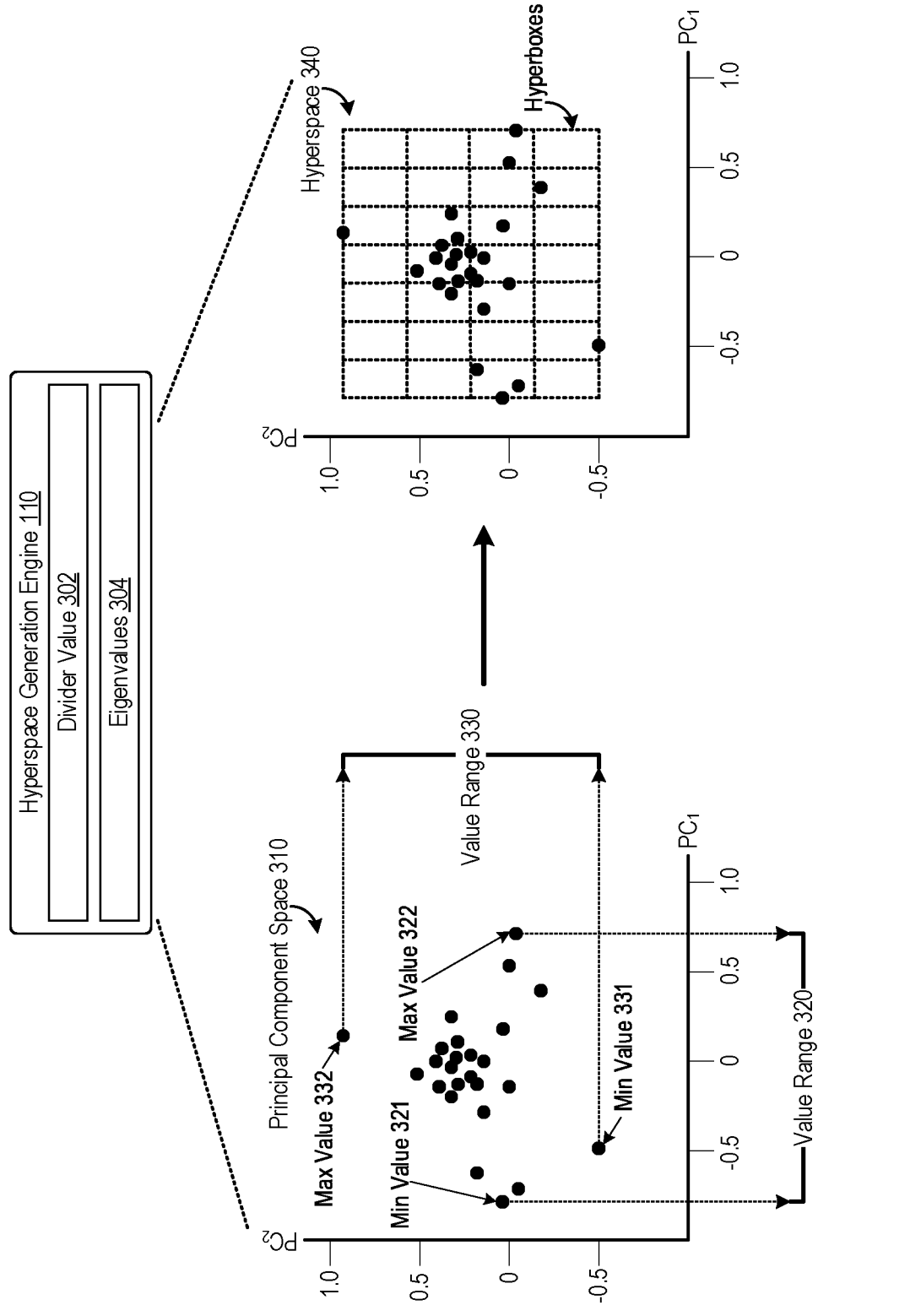
FIG. 3 shows an example determination of hyperbox dimensions by the hyperspace generation engine for a hyperspace quantized from a principal component space.

FIG. 3 shows an example determination of hyperbox dimensions by the hyperspace generation engine 110 for a hyperspace quantized from a principal component space. In determining hyperbox dimensions, the hyperspace generation engine 110 may access a divider value 302 and eigenvalues 304. The divider value 302 may be predetermined or user-configured, and the hyperspace generation engine 110 may control the numbering, density, or granularity of partitioned hyperboxes in a transformed feature space through the divider value 302. The eigenvalues 304 may refer to any indicator of variance among principal variables of a transformed feature space, and as an example may take the form of principal component eigenvalues for a principal component space transformed from the feature space of a dataset. Use of the divider value 302 and eigenvalues 304 by the hyperspace generation engine 110 in determining hyperbox dimensions is presented through the example of FIG. 3.

In FIG. 3, the hyperspace generation engine 110 quantizes an example transformed feature space shown in FIG. 3 as the principal component space 310. The principal component space 310 may be transformed from a feature space and include at least two principal components labeled as $PC_1$ and $PC_2$ along respective axes of the principal component space 310. To quantize the principal component space 310 into a hyperspace, the hyperspace generation engine 110 may identify a first principal component among the principal components of principal component space 310 with a highest variance for a dataset among the principal components of the principal component space 310. As noted herein, dataset variance attributable to principal components of a principal component space may be measured through determined principal component eigenvalues, and the hyperspace generation engine 110 may determine the first principal component as the principal component of the principal component space 310 with a greatest (e.g., numerically highest) eigenvalue. In the example of FIG. 3, the hyperspace generation engine 110 may determine the first principal component as $PC_1$ of the principal component space 310, e.g., by determining the highest eigenvalue among the accessed eigenvalues 304.

Next, the hyperspace generation engine 110 may determine a hyperbox dimension size along the principal component axis of the first principal component (in this example, along the $PC_1$ axis). The hyperspace generation engine 110 may set the dimension size of hyperboxes along the principal component axis of the first principal component as a function of a value range for the first principal component and a predetermined divider value, e.g., the divider value 302. In particular, the hyperspace generation engine 110 may determine a value range of the first principal component for a feature vector set mapped into the principal component space 310. As noted herein, a feature vector set of a dataset mapped into a principal component space by the hyperspace generation engine 110 may be referred to as a transformed feature vector set, and transformed feature vectors of a transformed feature vector set may comprise a set of principal component values transformed from the parameter values of a dataset based on the transformation of a feature vector space into a principal component space. In the example of FIG. 3, the principal component space 310 includes multiple data points, each representative of a transformed feature vector and mapped based on the particular principal component values of $PC_1$ and $PC_2$ for each respective transformed feature vector.

The value range of a principal component for a transformed feature vector set may provide a numerical indicator of the range of values included in a transformed feature vector set for a particular principal component. Accordingly, the hyperspace generation engine 110 may determine the value range of a given principal component as a difference between a minimum value for the given principal component in a transformed feature vector set and a maximum value for the given principal component in the transformed feature vector set. To illustrate through FIG. 3, the hyperspace generation engine 110 determines the value range 320 for the first principal component $PC_1$ (with, in this example, the highest eigenvalue among the eigenvalues 304) as a difference between a minimum value 321 for the first principal component in a transformed feature vector set and a maximum value 322 for the first principal component in the transformed feature vector set.

In some implementations, the hyperspace generation engine 110 may then set the dimension size of hyperboxes along the principal component axis of the first principal component as the value range divided by a predetermined divider value. In the example of FIG. 3, the divider value 302 may be set to a value of '7', and the hyperspace generation engine 110 may determine the hyperbox dimension value along the principal component axis for the first principal component $PC_1$ as the value range 320 divided by '7'. In effect, the hyperspace generation engine 110 may quantize the range of values for the first principal component in the transformed feature vector set into a preconfigured number of partitions or bins equal to the divider value 302. The number of partitioned bins may be configurable through the divider value 302, allowing the hyperspace generation engine 110 to flexibly control how granular, precise, sparse, or dense the hyperbox partitioning in a quantized hyperspace will be. In such a way, the hyperspace generation engine 110 may determine hyperbox dimensions values for a first principal component in the principal component space, doing so as a function of a value range for the first principal component and a predetermined divider value.

For the remaining principal components in a principal component space (aside from the first principal component space with a highest data variance for a dataset), the hyperspace generation engine 110 may determine dimension values as a function of the value range for the remaining principal components respectively, the predetermined divider value, and a variance ratio between the first and the remaining principal components respectively (e.g., as measured through the determined eigenvalues of the principal components). To illustrate, the hyperspace generation engine 110 may identify a second principal component $PC_2$ of the principal component space 310 with a determined eigenvalue lesser than the determined eigenvalue of the first principal component $PC_1$. Then, the hyperspace generation engine 110 may determine a value range 330 of the transformed feature vector set for the second principal component $PC_2$, in particular as a difference between a minimum value 331 for the second principal component in a transformed feature vector set and a maximum value 332 for the second principal component in the transformed feature vector set.

The hyperspace generation engine 110 may then set the dimension size of hyperboxes along a principal component axis of the second principal component $PC_2$ as a function of the value range 330 for the second principal component, the divider value 302, and a ratio between the determined eigenvalues of the first and second principal components. In some implementations, the hyperspace generation engine 110 may set the hyperbox dimension size for principal components $PC_2 \ldots PC_n$ as follows, (with $PC_1$ representing a first principal component with a greatest attributable variance and highest eigenvalue):

$$Hyperbox\_Dimension_i = \frac{Value\_Range_i}{ceil\left(\frac{Eigenvalue_{PC_i}}{Eigenvalue_{PC_1}} * divider\_value\right)}$$

In this example, the hyperspace generation engine 110 may divide the value range of principal component $PC_i$ by a lesser number than the divider value 302, doing so based on the ratio of the eigenvalue of principal component $PC_i$ to the eigenvalue of the first principal component $PC_1$. This may be the case as the eigenvalue of $PC_i$ may be less than the eigenvalue of the first principal component $PC_1$ (as the first principal component is identified by the hyperspace generation engine 110 has having a greatest eigenvalue), and thus the number of bins or partitions to divide the value range of principal component $PC_i$ may be lesser in number than the divider value 302 used to divide the value range of the first principal component $PC_1$. When the eigenvalue of principal component $PC_i$ is sufficiently less than the eigenvalue of principal component $PC_1$, the hyperspace generation engine 110 may determine not to partition the value range of principal component $PC_i$ (or understood differently, partition the value range of principal component $PC_i$ into one partition/bin). In such cases, the hyperbox generation engine 110 may determine a hyperbox dimension value for principal component $PC_i$ as the value range principal component $PC_i$.

By accounting for variance ratios in hyperbox dimension value determinations, the hyperspace generation engine 110 may partition a range of values along a particular principal component for a transformed feature space at lesser granularity or precision as compared to the number of partitions for a first principal component. Such a partition or bin granularity may vary based on the degree of variance in a dataset exhibited by the particular principal component. By doing so, the hyperspace generation engine 110 may flexibly account for differing degrees of variance in a dataset as exhibited through different principal components, and may set hyperbox dimensions for the varying principal components accordingly. For principal components in a transformed feature space attributed with higher degrees of dataset variance, the hyperspace generation engine 110 may divide the range of values for these principal components into a relatively greater number of partitions/bins as compared to other principal components in the transformed feature space attributed with lower degrees of dataset variance. As such, the hyperbox quantization of such principal component spaces may align with dataset variance, allowing for hyperboxes to partition off datasets (in the form of transformed feature vector sets) with an increased number of partitions along principal components higher variance, and vice versa. Such partitioning may increase data coverage, sampling effectiveness, or processing accuracy by ensuring that data dimensions with higher variation are processed at finer granularity through a relatively increased number of hyperboxes in the data dimension.

In FIG. 3, the hyperspace generation engine 110 quantizes the principal component space 310 into the hyperspace 340 comprised of multiple hyperboxes, with perimeters shown through dotted lines. In the hyperspace 340 generated in FIG. 3, the hyperspace generation engine 110 quantizes the principal component space 310 to cover the entire range of values of included in the transformed feature vector set for principal components $PC_1$ and $PC_2$. In the particular example shown in FIG. 3, the hyperspace generation engine 101 divides the value range 320 of the first principal component $PC_1$ into seven bins/partitions according to the configured value of '7' for the divider value 302. In doing so, the hyperspace generation engine 110 may accordingly set the hyperbox dimension value for the first principal component $PC_1$ as the value range 320 divided by '7'. For the hyperbox dimension value of principal component $PC_2$, the hyperspace generation engine 110 divides value range 330 by a value of '4', which in some implementations the hyperspace generation engine 110 may compute from the ratio between the eigenvalues of $PC_2$ and $PC_1$ and the divider value 302 (along with an applied ceiling function). In dividing the value range 330 by '4', the hyperspace generation engine 110 may set a hyperbox dimension value for principal component $PC_2$.

Accordingly, the hyperspace 340 in FIG. 3 includes twenty-eight (28) different hyperboxes that the hyperspace generation engine 110 may quantize from the principal component space 310. As seen in FIG. 3, the twenty-eight (28) hyperboxes quantized by the hyperspace generation engine 110 covers the entire range of values for the principal components $PC_1$ and $PC_2$ included in the transformed feature vector set. Note that the example principal component space 310 and example hyperspace 340 shown in FIG. 3 is illustrated for two dimensions ($PC_1$ and $PC_2$), but principal component spaces and hyperspaces may include any number of dimensions, for example further including dimensions for principal components $PC_3, \ldots PC_n$. In a consistent manner as described herein, the hyperspace generation engine 110 may determine hyperbox dimension values for each principal component of a principal component space, which may result in hyperboxes in the form of n-dimensional orthotopes with the determined dimension values for each dimension of a transformed feature space.

Note that in FIG. 3, the twenty-eight (28) hyperboxes in the hyperspace 340 cover the range of values of principal components $PC_1$ an $PC_2$ for an example dataset (as depicted through a mapping of transformed feature vectors in the hyperspace 340), but do not cover the entirety of the transformed feature space. In some implementations, the hyperspace generation engine 110 may extend a quantization of a transformed feature space to include hyperboxes across the entirety of the transformed feature space. To do so, the hyperspace generation engine 110 may insert additional hyperboxes with the determined hyperbox dimension values across portions of a transformed feature space outside, beyond, or otherwise not included in the range of values of a transformed feature vector set.

For instance, in the example of FIG. 3, the hyperspace generation engine 110 may insert additional hyperboxes into the hyperspace 340 with the same dimension values as the twenty-eight (28) hyperboxes determined from the range of values for principal components $PC_1$ and $PC_2$. For non-normalized datasets, such hyperbox insertions may extend indefinitely as transformed feature spaces (e.g., principal component spaces may themselves extend indefinitely). For normalized feature vectors or principal components with a limited range of values, the hyperspace generation engine 110 may truncate edge hyperboxes to the extent inserted hyperboxes extend beyond the limit of a transformed feature space. As such, extended hyperspaces may be used to process datasets with transformed feature vectors mapped to portions outside of hyperboxes partitioned for an original dataset used to generate a hyperspace.

By quantizing a transformed feature space into a hyperspace comprised of hyperboxes, the hyperspace generation engine 110 may, in effect, partition the transformed feature space into different bins, clusters, or partitions, doing so accounting for dataset variance. Each hyperbox of a hyperspace may act as a cluster element by which a dataset can be processed. Moreover, hyperbox dimension determination and transformed feature space quantization by the hyperspace generation engine 110 may be performed in O(n) time, allowing for clustering of transformed feature vectors of a dataset with increased computational efficiency while nonetheless supporting analyses that account for dataset variance.

Processing of a dataset through a generated hyperspace may be performed in multiple ways, some of which are described next with reference to FIGS. 4 and 5.

Figure 4:
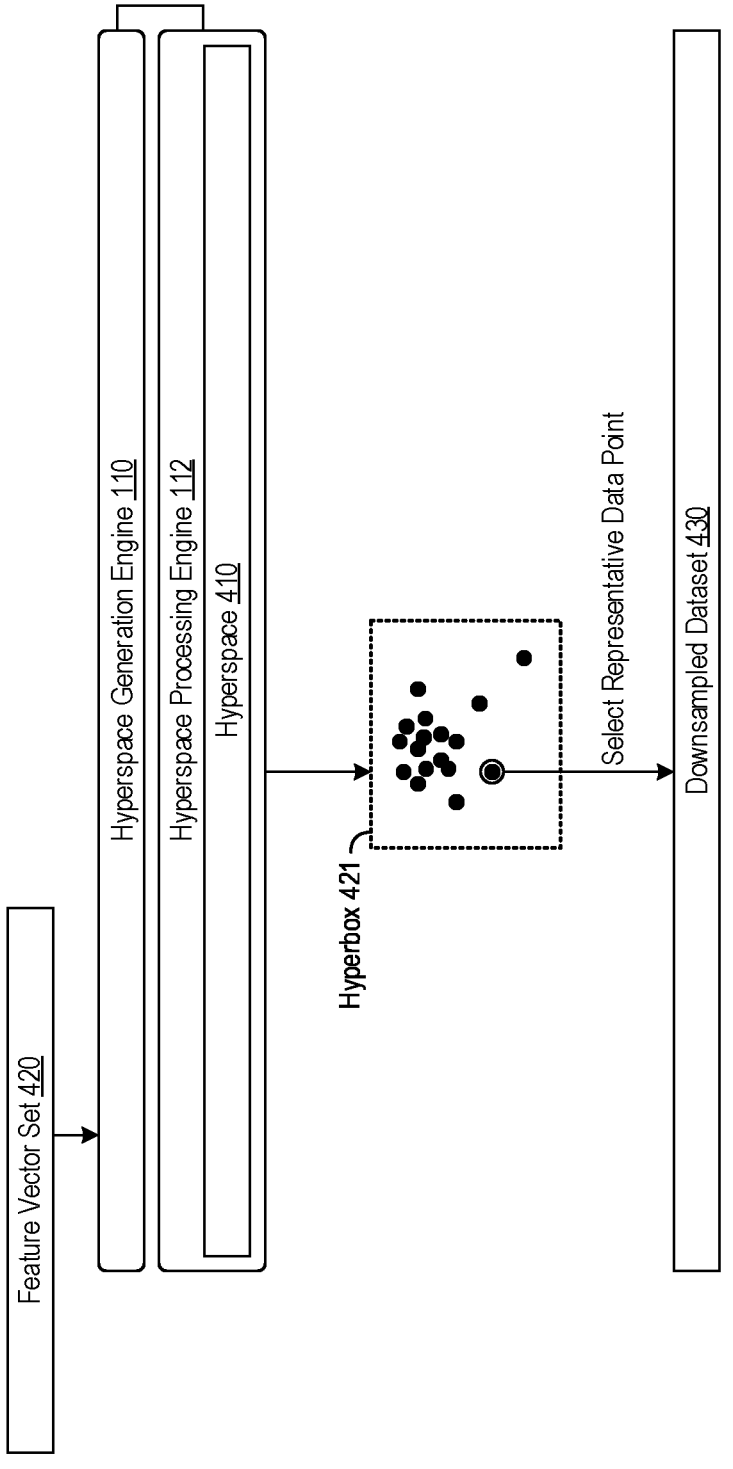
FIG. 4 shows an example of hyperspace-based processing to down sample a dataset using a generated hyperspace.

FIG. 4 shows an example of hyperspace-based processing to down sample a dataset using a generated hyperspace. In the example of FIG. 4, a hyperspace processing engine 112 may access a hyperspace 410 generated by the hyperspace generation engine 110. The hyperspace 410 may include a set of hyperboxes, with hyperbox dimension values determined by the hyperspace generation engine 110 for a given dataset represented by a corresponding feature vector set. In the example of FIG. 4, the hyperspace processing engine 112 may process a feature vector set 420 using the hyperspace 410.

Note that the feature vector set 420 may be used by the hyperspace generation engine 110 to generate the hyperspace 410 or may represent a different dataset from the dataset used to generate the hyperspace 410. As the hyperspace generation engine 110 may extend hyperbox coverage of a hyperspace beyond the range of values included a transformed feature vector set used to generate the hyperspace, the hyperspace 410 may therefore be used process datasets (and corresponding feature vector sets) that extend beyond the range of values of the original dataset used to generate the hyperspace 410.

To process the feature vector set 420 using the hyperspace 410, the hyperspace processing engine 112 may map the feature vector set 420 into the hyperspace 410. In doing so, the hyperspace processing engine 112 may transform feature vectors of the feature vector set 420 into a principal component space (or other transformed feature space) that the hyperspace 410 was quantized from, e.g., by applying a covariance matrix determined to transform a feature space into a principal component space. Then, the hyperspace processing engine 112 may process the transformed feature vector set mapped into the hyperspace 410.

Each of the transformed feature vectors may be bound by a respective hyperbox in the hyperspace 410, and the transformed feature vectors encapsulated by the same hyperbox may form a cluster for processing purposes. One such illustration is shown in FIG. 4 through the hyperbox 421, which contains multiple different transformed feature vectors. In that regard, the hyperspace processing engine 112 may map multiple feature vectors of the feature vector set 420 into the hyperspace 410, and the mapping of these multiple feature vectors in the hyperspace 410 may be located within the boundaries of the hyperbox 421 in particular. As such, the hyperspace processing engine 112 may group these multiple feature vectors (and corresponding datapoints in the represented dataset) as part of a same cluster, and process the cluster accordingly.

In the particular example of FIG. 4, the hyperspace processing engine 112 may down sample a dataset represented by the feature vector set 420 by selecting a representative feature vector from each hyperbox in the hyperspace 410 that includes at least mapped feature vector. Through such down sampling, the hyperspace processing engine 112 may obtain a downsampled dataset 430 by selecting a representative feature vector from each hyperbox that includes at least one feature vector mapped into the hyperbox. In such hyperspace-based down sampling, the hyperspace processing engine 112 may ignore (e.g., determine not to process) each hyperbox in the hyperspace 410 that does not include any transformed feature vectors. Such empty hyperboxes do not include any data from the feature vector set 420, and need not be down sampled by the hyperspace processing engine 112.

To select a representative transformed feature vector (corresponding to a particular data point of a dataset) of a hyperbox, the hyperspace processing engine 112 may employ various selection techniques. Using the hyperbox 421 illustrated in FIG. 4 as an example, the hyperspace processing engine 112 may choose a random sample from the transformed feature vectors within the hyperbox 421. As another example, the hyperspace processing engine 112 may select a sample data point closest to the hyperbox center. As yet another example, the hyperspace processing engine 112 may select a sample data point closest to a computed center of mass of the multiple data points within the hyperbox 421.

Through such hyperspace-based down sampling, the hyperspace processing engine 112 may efficiently down sample a dataset represented through the feature vector set 420. Any down sampling processing of large datasets may be performed through the hyperspace-based processing features described herein. For instance, the feature vector set 420 may represent large dataset of points-of-interest identified through bright field inspection (BFI) of manufactured ICs. The dataset of BFI-determined points of interest may number in the tens of million or more, and further investigation of the points of interest through SEM measurements may require down sampling on by an order of 10× or more. The hyperspace generation engine 110 may generate a hyperspace to cluster sample points in the BFI point-of-interest dataset through hyperboxes, and the hyperspace processing engine 112 may down sample the BFI point-of-interest dataset by selecting a representative datapoint from each hyperbox of hyperspace with at least one mapped data point (mapped as a transformed feature vector). Down sampling ratios can be further adjusted by configuring the predetermined divider value used to quantize the transformed feature space as described herein, e.g., by increasing the divider value to increase the number of down samples extracted from a feature vector set and vice versa.

While a specific BFI-SEM down sample example is described herein, any other down sample processing of datasets may be consistently implemented by the hyperspace generation engine 110, the hyperspace processing engine 112, or a combination of both.

Figure 5:
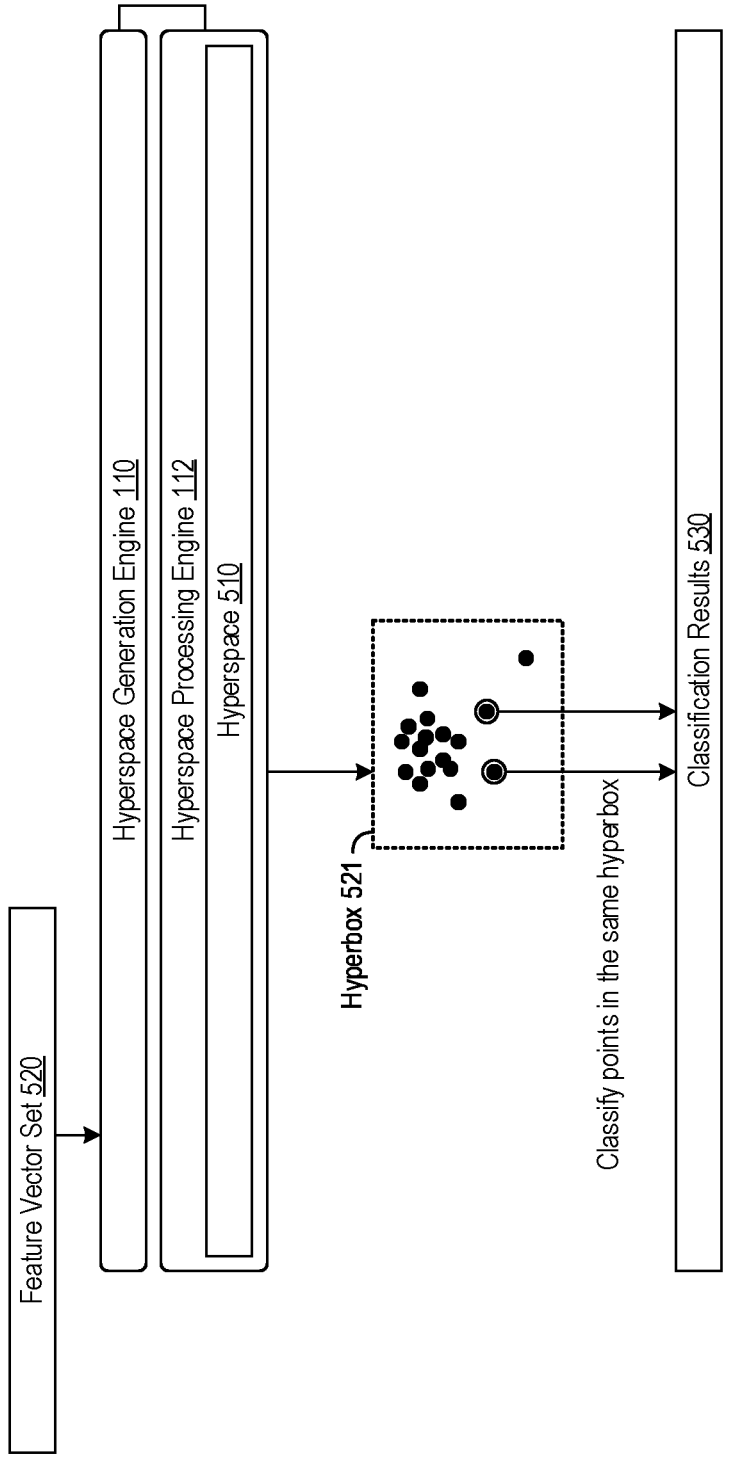
FIG. 5 shows an example of hyperspace-based processing to classify a dataset using a generated hyperspace.

FIG. 5 shows an example of hyperspace-based processing to classify a dataset using a generated hyperspace. In the example of FIG. 5, a hyperspace processing engine 112 may access a hyperspace 510 generated by the hyperspace generation engine 110. The hyperspace 510 may include a set of hyperboxes, with hyperbox dimension values determined by the hyperspace generation engine 110 for a given dataset represented by a corresponding feature vector set. In the example of FIG. 5, the hyperspace processing engine 112 may process a feature vector set 520 using the hyperspace 510.

Note that the feature vector set 520 may be used by the hyperspace generation engine 110 to generate the hyperspace 510 or may represent a different dataset from the dataset used to generate the hyperspace 510. As the hyperspace generation engine 110 may extend hyperbox coverage of a hyperspace beyond the range of values from a dataset used to generate the hyperspace, the hyperspace 510 may therefore be used process datasets (and corresponding feature vector sets) that extend beyond the range of values of the original dataset used to generate the hyperspace 510.

To process the feature vector set 520 using the hyperspace 510, the hyperspace processing engine 112 may map the feature vector set 520 into the hyperspace 510. In doing so, the hyperspace processing engine 112 may transform feature vectors of the feature vector set 520 into a principal component space (or other transformed feature space) that the hyperspace 510 was quantized from, e.g., by applying a covariance matrix determined to transform a feature space into a principal component space. Then, the hyperspace processing engine 112 may process the transformed feature vector set mapped into the hyperspace 510.

Each of the transformed feature vectors may be bound by a respective hyperbox in the hyperspace 510, and the transformed feature vectors encapsulated by the same hyperbox may form a cluster for processing purposes. One such illustration is shown in FIG. 5 through the hyperbox 521, which contains multiple different transformed feature vectors. In that regard, the hyperspace processing engine 112 may map multiple feature vectors of the feature vector set 520 into the hyperspace 510, and the positioning of these multiple feature vectors in the hyperspace 510 may be located within the boundaries of the hyperbox 521 in particular. As such, the hyperspace processing engine 112 may group these multiple feature vectors (and corresponding datapoints in the represented dataset) as part of a same cluster, and process the cluster accordingly.

In the particular example of FIG. 5, the hyperspace processing engine 112 may classify data points in the same hyperbox with a common classification. For instance, classification of data points in the hyperbox 521 may be assigned a common classification in a set of classification results 530. Such classification may be semi-supervised in the sense that data points represented in the feature vector set 520 or a different feature vector set used to generate the hyperspace 510 may be pre-classified based or otherwise labeled.

For instance, the hyperspace generation engine 110 may generate hyperspace 510 using a feature vector set comprised of known IC hotspots and known IC non-hotspots. In that sense, the hyperspace generation engine 110 can label hyperboxes of the hyperspace 510 that as "hotspot" hyperboxes responsive to a determination that a given hyperbox includes, contains, or encapsulates at least a threshold number of known IC hotspots from the feature vector set. With such a labeling, the hyperspace processing engine 112 may determine whether the hyperbox 521 is a "hotspot" or a "non-hotspot" hyperbox and classify the data points mapped into the hyperbox 521 accordingly. Note that such labeling of hyperboxes may occur prior to or concurrently with the processing of the feature vector set 520. For instance, the feature vector set 520 itself may include labeling of hotspot and non-hotspot IC data samples, and the hyperspace processing engine 112 may determine whether any of data points mapped into the hyperbox are "hotspot" data points in the feature vector set 520. If so, the hyperspace processing engine 112 may classify each of the remaining data points in the hyperbox 521 as a "hotspot" in the classification results 530.

In such a way, the hyperspace processing engine 112 may support hyperspace-based IC hotspot predictions for EDA applications. Other EDA dataset processing features are contemplated herein as well, for example fuzzy pattern matching. Each data point in the feature vector set 520 may represent a IC image, and the hyperspace processing engine 112 may support hyperspace-based fuzzy pattern matching of IC images. In particular, the hyperspace processing engine 112 may map the IC images of the feature vector set 520 into the hyperspace 510 and identify hyperboxes of the hyperspace 510 as a common class. The hyperspace processing engine 112 may "match" each IC image mapped to the same hyperbox as a matched image pattern, thus classifying, clustering, or grouping IC images of large EDA datasets efficiently and accurately.

Accordingly, various hyperspace-based processing features may be supported by the hyperspace generation engine 110, the hyperspace processing engine 112, or a combination of both. As noted herein, the hyperspace processing engine 112 may perform hyperspace-based processing of datasets that separate or different (at least in part) from a dataset used to generate the space. In that regard, the hyperspace generation engine 110 may access a different dataset comprising feature vectors different from a set of original feature vectors of the dataset used to generate a hyperspace. The hyperspace processing engine 112 may process the different dataset using the hyperspace determined from the original feature vectors, including by mapping the feature vectors of the different dataset into the hyperspace and processing the transformed feature vectors of the different dataset accordingly.

While many hyperspace features have been described herein through illustrative examples presented through various figures, the hyperspace generation engine 110 and the hyperspace processing engine 112 may implement any combination of the hyperspace features described herein. Some examples of hyperspace generation and processing in the context of EDA applications are provided herein, but the hyperspace features described herein may be consistently applied for any type of dataset and dataset classification, clustering, down sampling, or other form of data processing.

Figure 6:
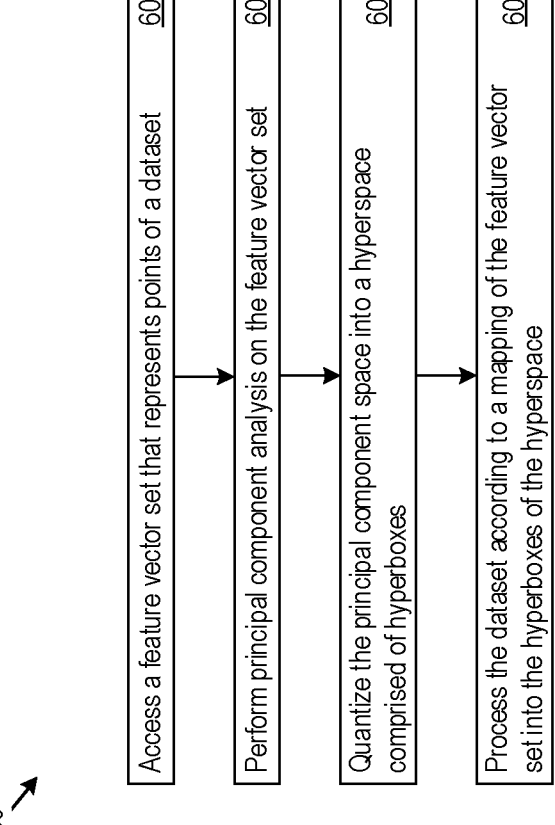
FIG. 6 shows an example of logic that a system may implement to support hyperspace generation and hyperspace-based processing of datasets.

FIG. 6 shows an example of logic 600 that a system may implement to hyperspace generation and hyperspace-based processing of datasets. For example, the computing system 100 may implement the logic 600 as hardware, executable instructions stored on a machine-readable medium, or as a combination of both. The computing system 100 may implement the logic 600 via the hyperspace generation engine 110 and the hyperspace processing engine 112, through which the computing system 100 may perform or execute the logic 600 as a method to support hyperspace generation and hyperspace-based processing of datasets. The following description of the logic 600 is provided using the hyperspace generation engine 110 and the hyperspace processing engine 112 as examples. However, various other implementation options by systems are possible.

In implementing the logic 600, the hyperspace generation engine 110 may access a feature vector set that represents points in a dataset (602). For instance, a given feature vector in the feature vector set may represent values for multiple parameters of a given data point in a dataset. The hyperspace generation engine 110 may also perform a principal component analysis on the feature vector set (604). The principal component analysis performed by the hyperspace generation engine 110 may transform a feature space of the feature vector set into a principal component space comprised of principal component axes rotated from the feature space and rotation of the principal component axes from the feature space may be based on eigenvalues determined for the principal components of the principal component space. The hyperspace generation engine 110 may further quantize the principal component space into a hyperspace comprised of hyperboxes (606), doing so in any of the ways described herein. In implementing the logic 600, the hyperspace processing engine 112 may process the dataset according to a mapping of the feature vector set into the hyperboxes of the hyperspace (608).

The logic 600 shown in FIG. 6 provides an illustrative example by which a computing system 100 may support hyperspace generation and hyperspace-based processing of datasets. Additional or alternative steps in the logic 600 are contemplated herein, including according to any of the various features described herein for the hyperspace generation engine 110, the hyperspace processing engine 112, or any combinations thereof.

Figure 7:
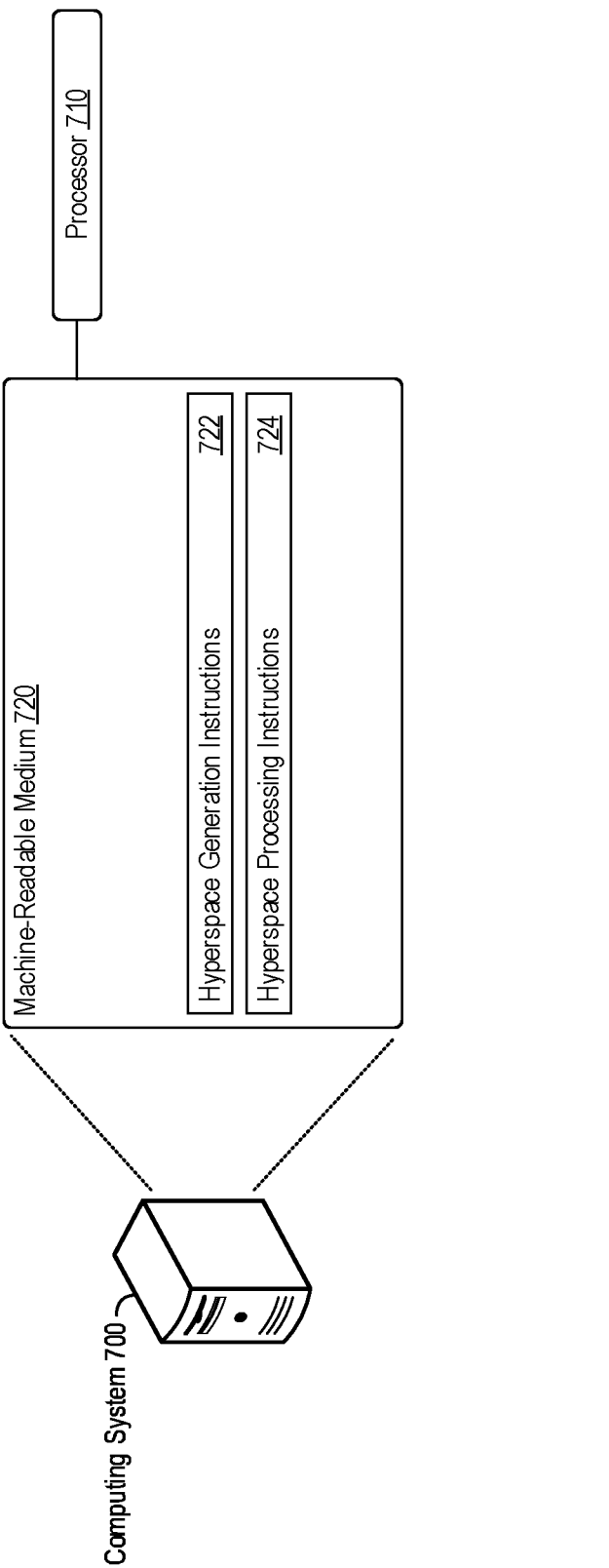
FIG. 7 shows an example of a computing system that supports hyperspace generation and hyperspace-based processing of datasets.

FIG. 7 shows an example of a computing system 700 that supports hyperspace generation and hyperspace-based processing of datasets. The computing system 700 may include a processor 710, which may take the form of a single or multiple processors. The processor(s) 710 may include a central processing unit (CPU), microprocessor, or any hardware device suitable for executing instructions stored on a machine-readable medium. The system 700 may include a machine-readable medium 720. The machine-readable medium 720 may take the form of any non-transitory electronic, magnetic, optical, or other physical storage device that stores executable instructions, such as the hyperspace generation instructions 722 and the hyperspace processing instructions 724 shown in FIG. 7. As such, the machine-readable medium 720 may be, for example, Random Access Memory (RAM) such as a dynamic RAM (DRAM), flash memory, spin-transfer torque memory, an Electrically-Erasable Programmable Read-Only Memory (EEPROM), a storage drive, an optical disk, and the like.

The computing system 700 may execute instructions stored on the machine-readable medium 720 through the processor 710. Executing the instructions (e.g., the hyperspace generation instructions 722 and/or the hyperspace processing instructions 724) may cause the computing system 700 to perform any of the hyperspace features described herein, including according to any of the features of the hyperspace generation engine 110, the hyperspace processing engine 112, or combinations of both.

For example, execution of the hyperspace generation instructions 722 by the processor 710 may cause the computing system 700 to access a feature vector set, wherein a given feature vector in the feature vector set represents values for multiple parameters of a given data point in a dataset; perform a principal component analysis on the feature vector set, wherein the principal component analysis transforms a feature space of the feature vector set into a principal component space comprised of principal component axes rotated from the feature space and wherein rotation of the principal component axes from the feature space is based on eigenvalues determined for the principal components of the principal component space; and quantize the principal component space into a hyperspace comprised of hyperboxes. Execution of the hyperspace processing instructions 724 by the processor 710 may cause the computing system 700 to process the dataset according to a mapping of the feature vector set into the hyperboxes of the hyperspace.

Any additional or alternative hyperspace features as described herein may be implemented via the hyperspace generation instructions 722, hyperspace processing instructions 724, or a combination of both.

The systems, methods, devices, and logic described above, including the hyperspace generation engine 110 and the hyperspace processing engine 112, may be implemented in many different ways in many different combinations of hardware, logic, circuitry, and executable instructions stored on a machine-readable medium. For example, the hyperspace generation engine 110, the hyperspace processing engine 112, or combinations thereof, may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. A product, such as a computer program product, may include a storage medium and machine-readable instructions stored on the medium, which when executed in an endpoint, computer system, or other device, cause the device to perform operations according to any of the description above, including according to any features of the hyperspace generation engine 110, the hyperspace processing engine 112, or combinations thereof.

The processing capability of the systems, devices, and engines described herein, including the hyperspace generation engine 110 and the hyperspace processing engine 112, may be distributed among multiple system components, such as among multiple processors and memories, optionally including multiple distributed processing systems or cloud/network elements. Parameters, databases, and other data structures may be separately stored and managed, may be incorporated into a single memory or database, may be logically and physically organized in many different ways, and may be implemented in many ways, including data structures such as linked lists, hash tables, or implicit storage mechanisms. Programs may be parts (e.g., subroutines) of a single program, separate programs, distributed across several memories and processors, or implemented in many different ways, such as in a library (e.g., a shared library).

While various examples have been described above, many more implementations are possible.

The invention claimed is:

1. A method comprising:
by a computing system:
    accessing a feature vector set, wherein a given feature vector in the feature vector set represents values for multiple parameters of a given data point in a dataset;
    performing a principal component analysis on the feature vector set, wherein the principal component analysis transforms a feature space of the feature vector set into a principal component space comprised of principal component axes rotated from the feature space and wherein rotation of the principal component axes from the feature space is based on eigenvalues determined for the principal components of the principal component space;
    quantizing the principal component space into a hyperspace comprised of hyperboxes, wherein each hyperbox in the hyperspace has a number of dimensions equal to a number of principal components in the principal component space and wherein a dimension size of each hyperbox along a given principal component axis is a function of the determined eigenvalue of a particular principal component of the given principal component axis and wherein quantizing the principal component space into the hyperspace comprises:
        mapping the feature vector set into the principal component space to obtain a transformed feature vector set;

identifying a first principal component of the principal components with a highest determined eigenvalue:
        determining a value range of the transformed feature vector set for the first principal component; and
        setting the dimension size of each hyperbox along a principal component axis of the first principal component as a function of the value range for the first principal component and a predetermined divider value; and
    processing the dataset according to a mapping of the feature vector set into the hyperboxes of the hyperspace.

2. The method of claim 1, comprising determining the value range of the first principal component as a difference between a minimum value for the first principal component in the transformed feature vector set and a maximum value for the first principal component in the transformed feature vector set; and
    setting the dimension size of each hyperbox along the principal component axis of the first principal component as the determined value range divided by the predetermined divider value.

3. The method of claim 1, wherein quantizing the principal component space into the hyperspace further comprises:
    identifying a second principal component of the principal components with a determined eigenvalue lesser than the determined eigenvalue of the first principal component;
    determining a value range of the transformed feature vector set for the second principal component; and
    setting the dimension size of each hyperbox along a principal component axis of the second principal component as a function of the value range for the second principal component, the predetermined divider value, and a ratio between the determined eigenvalues of the first and second principal components.

4. The method of claim 1, wherein further processing comprises obtaining a downsampled dataset, including by selecting a representative feature vector from each hyperbox that includes at least one feature vector mapped into the hyperbox.

5. The method of claim 1, further comprising:
    accessing a different dataset comprising feature vectors different from the feature vectors of the dataset; and
    processing the different dataset using the hyperspace determined from the feature vector set, including by mapping the feature vectors of the different dataset into the hyperspace.

6. A system comprising:
a hyperspace generation engine configured to:
    access a feature vector set, wherein a given feature vector in the feature vector set represents values for multiple parameters of a given data point in a dataset;
    perform a principal component analysis on the feature vector set, wherein the principal component analysis transforms a feature space of the feature vector set into a principal component space comprised of principal component axes rotated from the feature space and wherein rotation of the principal component axes from the feature space is based on eigenvalues determined for the principal components of the principal component space; and
    quantize the principal component space into a hyperspace comprised of hyperboxes, wherein each hyperbox in the hyperspace has a number of dimensions equal to a number of principal components in the principal component space and wherein a dimension size of each hyperbox along a given principal component axis is a function of the determined eigenvalue of a particular principal component of the given principal component axis and wherein the hyperspace generation engine is configured to quantize the principal component space into the hyperspace by:

mapping the feature vector set into the principal component space to obtain a transformed feature vector set;

identifying a first principal component of the principal components with a highest determined eigenvalue;

determining a value range of the transformed feature vector set for the first principal component; and setting the dimension size of each hyperbox along a principal component axis of the first principal component as a function of the value range for the first principal component and a predetermined divider value; and a hyperspace processing engine configured to process the dataset according to a mapping of the feature vector set into the hyperboxes of the hyperspace.

7. The system of claim 6, wherein the hyperspace generation engine is configured to determine the value range of the first principal component as a difference between a minimum value for the first principal component in the transformed feature vector set and a maximum value for the first principal component in the transformed feature vector set; and wherein the hyperspace generation engine is configured to set the dimension size of each hyperbox along the principal component axis of the first principal component as the determined value range divided by the predetermined divider value.

8. The system of claim 6, wherein the hyperspace generation engine is configured to quantize the principal component space into the hyperspace further by:

identifying a second principal component of the principal components with a determined eigenvalue lesser than the determined eigenvalue of the first principal component;

determining a value range of the transformed feature vector set for the second principal component; and setting the dimension size of each hyperbox along a principal component axis of the second principal component as a function of the value range for the second principal component, the predetermined divider value, and a ratio between the determined eigenvalues of the first and second principal components.

9. The system of claim 6, wherein the hyperspace processing engine is configured to process the dataset by obtaining a downsampled dataset, including by selecting a representative feature vector from each hyperbox that includes at least one feature vector mapped into the hyperbox.

10. The system of claim 6, wherein the hyperspace generation engine is further configured to access a different dataset comprising feature vectors different from the feature vectors of the dataset; and wherein the hyperspace processing engine is further configured to process the different dataset using the hyperspace determined from the feature vector set, including by mapping the feature vectors of the different dataset into the hyperspace.

11. A non-transitory machine-readable medium comprising instructions that, when executed by a processor, cause a computing system to:

access a feature vector set, wherein a given feature vector in the feature vector set represents values for multiple parameters of a given data point in a dataset;

perform a principal component analysis on the feature vector set, wherein the principal component analysis transforms a feature space of the feature vector set into a principal component space comprised of principal component axes rotated from the feature space and wherein rotation of the principal component axes from the feature space is based on eigenvalues determined for the principal components of the principal component space;

quantize the principal component space into a hyperspace comprised of hyperboxes, wherein hyperboxes in the hyperspace have a number of dimensions equal to a number of principal components in the principal component space and wherein a dimension size of the hyperboxes along a given principal component axis is a function of the determined eigenvalue of a particular principal component of the given principal component axis and wherein the instructions cause the computing system to quantize the principal component space into the hyperspace by:

mapping the feature vector set into the principal component space to obtain a transformed feature vector set;

identifying a first principal component of the principal components with a highest determined eigenvalue;

determining a value range of the transformed feature vector set for the first principal component; and setting the dimension size of the hyperboxes along a principal component axis of the first principal component as a function of the value range for the first principal component and a predetermined divider value; and process the dataset according to a mapping of the feature vector set into the hyperboxes of the hyperspace.

12. The non-transitory machine-readable medium of claim 11, wherein the instructions cause the computing system to quantize the principal component space into the hyperspace further by:

identifying a second principal component of the principal components with a determined eigenvalue lesser than the determined eigenvalue of the first principal component;

determining a value range of the transformed feature vector set for the second principal component; and setting the dimension size of each hyperbox along a principal component axis of the second principal component as a function of the value range for the second principal component, the predetermined divider value, and a ratio between the determined eigenvalues of the first and second principal components.

13. The non-transitory machine-readable medium of claim 11, wherein the instructions cause the computing system to process the dataset by obtaining a downsampled dataset, including by selecting a representative feature vector from each hyperbox that includes at least one feature vector mapped into the hyperbox.

14. The non-transitory machine-readable medium of claim 11, wherein the instructions further cause the computing system to:

access a different dataset comprising feature vectors different from the feature vectors of the dataset; and process the different dataset using the hyperspace determined from the feature vector set, including by mapping the feature vectors of the different dataset into the hyperspace.

* * * * *